(12) United States Patent
Qin

(10) Patent No.: US 11,667,518 B2
(45) Date of Patent: Jun. 6, 2023

(54) MEMS PACKAGING STRUCTURE AND MANUFACTURING METHOD THEREFOR

(71) Applicant: NINGBO SEMICONDUCTOR INTERNATIONAL CORPORATION (SHANGHAI BRANCH), Shanghai (CN)

(72) Inventor: Xiaoshan Qin, Zhejiang (CN)

(73) Assignee: NINGBO SEMICONDUCTOR INTERNATIONAL CORPORATION (SHANGHAI BRANCH), Shanghai (CN)

( * ) Notice: Subject to any disclaimer, the term of this patent is extended or adjusted under 35 U.S.C. 154(b) by 155 days.

(21) Appl. No.: 17/419,191

(22) PCT Filed: Nov. 5, 2019

(86) PCT No.: PCT/CN2019/115607
§ 371 (c)(1),
(2) Date: Jun. 28, 2021

(87) PCT Pub. No.: WO2020/134586
PCT Pub. Date: Jul. 2, 2020

(65) Prior Publication Data
US 2022/0112075 A1    Apr. 14, 2022

(30) Foreign Application Priority Data

Dec. 27, 2018    (CN) .......................... 201811615846.0

(51) Int. Cl.
*B81B 7/00*    (2006.01)
*B81C 1/00*    (2006.01)

(52) U.S. Cl.
CPC .......... *B81B 7/0032* (2013.01); *B81C 1/0023* (2013.01); *B81B 2201/02* (2013.01);
(Continued)

(58) Field of Classification Search
None
See application file for complete search history.

(56) References Cited

U.S. PATENT DOCUMENTS

2016/0167949 A1    6/2016    Jiang
2022/0063987 A1*   3/2022    Qin .......................... B81B 7/02
(Continued)

FOREIGN PATENT DOCUMENTS

CN    101391742 A    3/2009
CN    102689874 A    9/2012
(Continued)

*Primary Examiner* — Michael Lebentritt
(74) *Attorney, Agent, or Firm* — Muncy, Geissler, Olds & Lowe, P.C.

(57) ABSTRACT

A micro-electro-mechanical system (MEMS) package structure and a method for fabricating the MEMS package structure. The MEMS package structure includes a MEMS die (200) and a device wafer (100). A control unit and an interconnection structure (300) are formed in the device wafer (100), and a first contact pad (410) and an input-output connecting member (420) are formed on a first bonding surface (100*a*) of the device wafer (100). The MEMS die (200) is coupled to the first bonding surface (100*a*) through a bonding layer (500). The MEMS die (200) includes a closed micro-cavity (220) and a second contact pad (220). The first contact pad (410) is electrically connected to a corresponding second contact pad (220). An opening (510) that exposes the input-output connecting member (420) is formed in the bonding layer (500). The MEMS package structure allows electrical interconnection between the MEMS die (200) and the device wafer (100) with a reduced package size, compared to those produced by existing integration techniques. In addition, function integration ability of the package structure is improved by integrating a plurality of MEMS dies of the same or different structures and functions on the same device wafer.

16 Claims, 3 Drawing Sheets

(52) U.S. Cl.
CPC ..... *B81B 2207/012* (2013.01); *B81B 2207/07* (2013.01); *B81B 2207/092* (2013.01); *B81C 2203/0118* (2013.01); *B81C 2203/0792* (2013.01)

(56) References Cited

U.S. PATENT DOCUMENTS

| | | | |
|---|---|---|---|
| 2022/0063988 A1* | 3/2022 | Qin | B81B 7/02 |
| 2022/0112075 A1* | 4/2022 | Qin | B81C 1/00301 |
| 2022/0112076 A1* | 4/2022 | Qin | B81C 1/0023 |
| 2022/0112077 A1* | 4/2022 | Qin | B81B 7/007 |

FOREIGN PATENT DOCUMENTS

| | | |
|---|---|---|
| CN | 102967407 A | 3/2013 |
| CN | 103325703 A | 9/2013 |
| CN | 104609358 A | 5/2015 |
| CN | 105609433 A | 5/2016 |
| CN | 206417860 U | 8/2017 |
| TW | 201332065 A | 8/2013 |

* cited by examiner

MEMS PACKAGING STRUCTURE AND MANUFACTURING METHOD THEREFOR

TECHNICAL FIELD

The present invention relates to the field of semiconductor technology and, in particular, to a micro-electro-mechanical system (MEMS) package structure and a method for fabricating it.

BACKGROUND

The development of very-large-scale integration (VLSI) is leading to increasing shrinkage of critical dimensions of integrated circuits, imposing more and more stringent requirements on integrated circuit packaging techniques. In the market for MEMS sensor packages, MEMS dies have been widely used in smart phones, fitness wristbands, printers, automobiles, drones, head-mounted VR/AR devices and many other products. Common MEMS dies include, among others, those for pressure sensors, accelerometers, gyroscopes, MEMS microphones, optical sensors and catalytic sensors. A MEMS die is usually integrated with another die using a system in package (SiP) approach to form a MEMS device. Specifically, the MEMS die is usually fabricated on one wafer and integrated with an associated control circuit that is formed on another wafer. Currently, the integration is usually accomplished by either of the following two methods: 1) separately bonding the MEMS die-containing wafer and the control circuit-containing wafer to a single packaging substrate and electrically connecting the MEMS die to the control circuit through wiring the MEMS die-containing wafer and the control circuit-containing wafer to solder pads on the substrate; and 2) directly bonding the MEMS die-containing to control circuit-containing wafer with corresponding solder pads thereof forming electrical connections so as to achieve electrical connections between the control circuit and the MEMS die.

However, the above first integration method requires reserved areas for the solder pads, which are often large and thus unfavorable to miniaturization of the resulting MEMS device. MEMS dies with different functions (or structures) are fabricated generally with different processes, and it is usually only possible to fabricate MEMS dies of the same function (or structure) on a single wafer. Therefore, for the above second integration method, it is difficult to form MEMS dies of different functions on a single wafer using semiconductor processes, and it will be complicated in process, costly and bulky in size of the resulting MEMS device to separately bond wafers containing MEMS dies of different functions to wafers containing respective control circuits and then interconnect them together. Thus, the current integration methods for MEMS dies and the resulting MEMS packages structure still fall short in meeting the requirements of practical applications in terms of size and function integration ability.

SUMMARY OF THE INVENTION

It is an object of the present invention to provide a MEMS package structure with a reduced size and a method of fabricating such a package structure. It is another object of the present invention to provide a MEMS package structure with enhanced function integration ability.

In one aspect of the present invention, there is provided a MEMS package structure, comprising:

a device wafer having a first bonding surface, wherein the device wafer has a control unit and an interconnection structure electrically connected to the control unit formed therein; a first contact pad arranged on the first bonding surface, wherein the first contact pad is electrically connected to the interconnection structure; a MEMS die bonded to the first bonding surface, wherein the MEMS die comprises a closed micro-cavity, a second contact pad configured to be coupled to an external electrical signal and a second bonding surface in opposition to the first bonding surface, the first contact pad electrically connected to a corresponding second contact pad; a bonding layer positioned between the first bonding surface and the second bonding surface so as to bond the MEMS die to the device wafer, wherein an opening is formed in the bonding layer; and an input-output connecting member arranged on the first bonding surface, wherein the input-output connecting member is exposed in the opening.

Optionally, a plurality of said MEMS dies may be bonded to the first surface, wherein the MEMS dies are categorized in the same or different types depending on a fabrication process thereof.

Optionally, a plurality of MEMS dies are bonded to the first bonding surface, and wherein the plurality of MEMS dies are categorized in a same or different types depending on a vacuum level of the micro-cavity thereof.

Optionally, a plurality of MEMS dies are arranged on the first bonding surface, and wherein the plurality of MEMS dies include at least one of: a gyroscope, an accelerometer, an inertial sensor, a pressure sensor, a displacement sensor and a micro-actuator.

Optionally, the control unit may comprise one or more MOS transistors.

Optionally, the interconnection structure may comprise a conductive plug extending through at least a partial thickness of the device wafer and electrically connected to the control unit, and wherein the first contact pad is electrically connected to the conductive plug.

Optionally, the first contact pad may be electrically connected to the corresponding second contact pad via an electrical bump, and wherein the electrical bump is positioned between the first contact pad and the corresponding second contact pad, and is exposed in the opening.

Optionally, the MEMS package structure may further comprise:

an encapsulation layer located on the first bonding surface, wherein the encapsulation layer covers the MEMS die and fills the opening in the bonding layer, and wherein the input-output connecting member is exposed from the encapsulation layer.

Optionally, the input-output connecting member corresponds to the first contact pad and is electrically connected thereto.

Optionally, the bonding layer may comprise an adhesive material.

Optionally, the adhesive material may comprise a dry film.

Optionally, the micro-cavity may be filled with a damping gas or is vacuumed.

In another aspect of the present invention, there is further provided a method for fabricating a MEMS package structure, comprising:

providing a MEMS die and a device wafer for control of the MEMS die, wherein the device wafer has a first bonding surface, and wherein the device wafer has a control unit and an interconnection structure electrically connected to the control unit formed therein; forming a first contact pad and an input-output connecting member on the first bonding surface, wherein the first contact pad is electrically connected to the interconnection structure, wherein the MEMS die comprises a closed micro-cavity, a second contact pad configured to be coupled to an external electrical signal and a second bonding surface; bonding the MEMS die to the device wafer through a bonding layer positioned between the first bonding surface and the second bonding surface, wherein the bonding layer has an opening formed therein, wherein the first contact pad, a corresponding second contact pad and the input-output connecting member are exposed in the opening; establishing an electrical connection between the first contact pad and the corresponding second contact pad.

Optionally, the interconnection structure may comprise a conductive plug, wherein the conductive plug extends through at least a partial thickness of the device wafer and is electrically connected to the control unit, and wherein the first contact pad is electrically connected to a corresponding conductive plug.

Optionally, establishing the electrical connection between the first contact pad and the corresponding second contact pad comprises: forming an electrical bump between the first contact pad and the corresponding second contact pad using an electroless plating process, wherein the electrical bump is exposed in the opening.

Optionally, the method may further comprise, subsequent to forming the electrical connection between the first contact pad and the corresponding second contact pad:

forming an encapsulation layer on the first bonding surface, wherein the encapsulation layer covers the MEMS die and fills the opening, with the input-output connecting member being exposed from the encapsulation layer.

A MEMS package structure is provided in the present invention. The device wafer has a control unit and an interconnection structure electrically connected to the control unit arranged therein. A first contact pad and an input-output connecting member are arranged on the first bonding surface of the device wafer. The MEMS die has a closed micro-cavity, a second contact pad configured to be coupled to an external electrical signal and a second bonding surface in opposition to the first bonding surface. A bonding layer is positioned between the first bonding surface and the second bonding surface so as to bond the MEMS die to the device wafer. The first contact pad is electrically connected to a corresponding second contact pad. An opening is formed in the bonding layer and the input-output connecting member is exposed in the opening. The MEMS package structure allows an electrical interconnection between the MEMS die and the device wafer with a reduced package size, compared to those produced by existing integration techniques. The input-output connecting member may be configured to be coupled to the external signal. Moreover, the MEMS package structure may include a plurality of MEMS dies of the same or different functions and structures. Therefore, in addition to size shrinkage, the MEMS package structure is also improved in terms of function integration ability.

A method for fabricating a MEMS package structure is provided in the present invention, wherein a first contact pad and an input-output connecting member are formed on the first bonding surface of the device wafer; the first contact pad is electrically connected to the interconnection structure, wherein the MEMS die comprises a closed micro-cavity, a second contact pad configured to be coupled to an external electrical signal and a second bonding surface; bonding the MEMS die to the device wafer through a bonding layer; the bonding layer has an opening formed therein, wherein the first contact pad, a corresponding second contact pad and the input-output connecting member are exposed in the opening; establishing an electrical connection between the first contact pad and the corresponding second contact pad. Thus, achieving an electrical interconnection between the MEMS die and the device wafer with a reduced package size, compared to those produced by existing integration techniques. Moreover, the MEMS dies may be selected flexibly, for example, a plurality of MEMS dies of the same or different functions and structures may be integrated on a same device wafer. Therefore, in addition to size shrinkage, the MEMS package structure is also improved in terms of function integration ability.

In these figures,

100: a device wafer; 100a: a first bonding surface; 101: a substrate; 102: an isolation structure; 103: a first dielectric layer; 104: a second dielectric layer; 200: a MEMS die; 210: a micro-cavity; 220: a second contact pad; 300: an interconnection structure; 310: a conductive plug; 410: a first contact pad; 420: an input-output connecting member; 500: a bonding layer; 510: an opening; 501: an encapsulation layer; 600: an electrical bump.

DETAILED DESCRIPTION

The present invention will be described below in greater detail by way of particular embodiments with reference to the accompanying drawings. Features and advantages of the invention will be more apparent from the following description. Note that the accompanying drawings are provided in a very simplified form not necessarily drawn to exact scale, and their only intention is to facilitate convenience and clarity in explaining the disclosed embodiments.

In the following, the terms "first", "second", and so on may be used to distinguish between similar elements without necessarily implying any particular ordinal or chronological sequence. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Identical components or features may be shown in different accompanying drawings, and not all such components and features are labeled in each drawing for the sake of visual clarity, even if they are readily identifiable in all the drawings.

Figure 5:
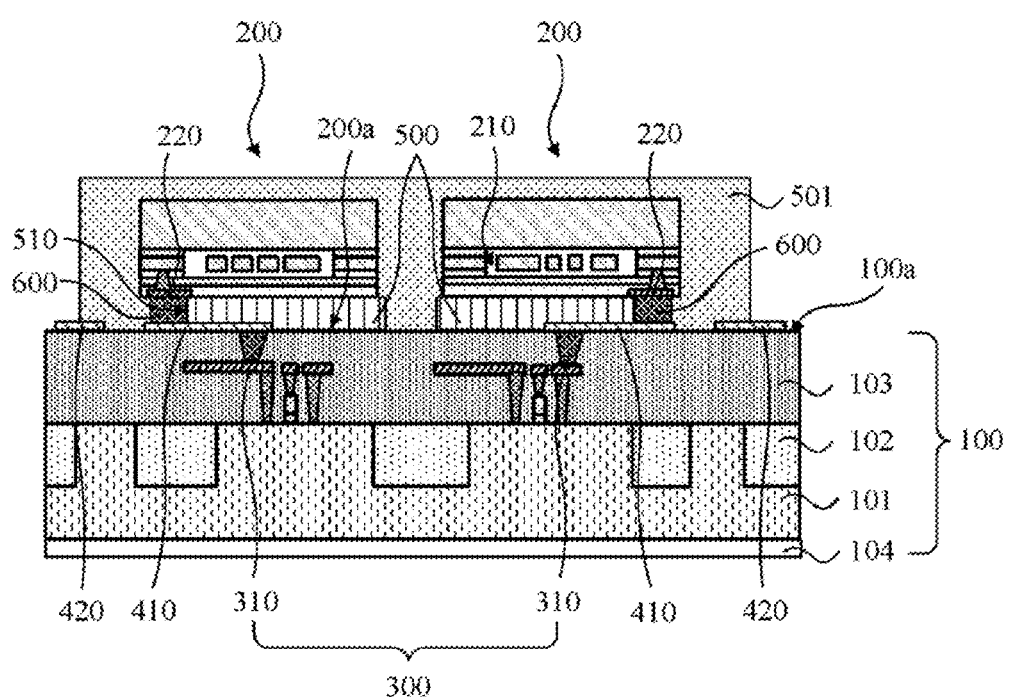
FIG. 5 is a schematic cross-sectional view showing a structure resulting from the formation of an encapsulation layer in the method of fabricating a MEMS package structure in accordance with an embodiment of the present invention.

Referring to FIG. 5, a micro-electro-mechanical system (MEMS) package structure according to an embodiment of the present invention includes: a MEMS die 200 and a device wafer 100 having a first bonding surface 100a; the device wafer 100 has a control unit and an interconnection structure 300 electrically connected to the control unit formed therein; a first contact pad 410 and an input-output connecting member 420 arranged on the first bonding surface 100a, the first contact pad 410 electrically connected to the interconnection structure 300 to lead the electrical signal of the control unit; the input-output connecting member 420 is configured to connect the MEMS package structure with the external signal or device so as to process or control the circuit signal connected to the input-output connecting member 420. As an example, the input-output connecting member 420 corresponds to and is electrically connected to the first contact pad 410, so that the input-output connecting member 420 can process or control the electrical signal at the first contact pad 410.

The MEMS package structure may include a plurality of said MEMS dies 200, which are bonded to the first bonding surface 100a and are driven by, or operate under the control of, respective said control units that are corresponding to the plurality of said MEMS dies 200 and are arranged in the device wafer 100. The device wafer 100 may be formed, for example, by fabricating the plurality of control units in a substrate 101 (e.g., a silicon substrate), using a semiconductor process. The substrate 101 may be, among others, a silicon substrate or a silicon-on-insulator (SOI) substrate. Examples of materials from which the substrate 101 can be fabricated may also include germanium, silicon germanium, silicon carbide, gallium arsenide, indium gallium and other Group III and V compounds. Preferably, the substrate 101 is selected as a substrate allowing relatively easy semiconductor processing or integration. The control units may be formed on the basis of the substrate 101.

Each control unit may include one or more MOS transistors, and in the latter case, adjacent said MOS transistors may be isolated from one another by isolation structure(s) 102 formed in the device wafer 100 (or in the substrate 101) and by an insulating material deposited on the substrate 101. Each isolation structure 102 may be, for example, a shallow trench isolation (STI) and/or deep trench isolation (DTI) structure. As an example, the control unit may control the MEMS die 200 by a control electrical signal output from a source/drain of one of the MOS transistor(s). In this embodiment, the device wafer 100 further comprises a first dielectric layer 103 formed on one of the surfaces of the substrate 101, and the source/drain of the MOS transistor of the control unit for outputting a control electrical signal (i.e., serving as an electrical connection terminal) is arranged in the first dielectric layer 103. On the other surface of the substrate 101, a second dielectric layer 104 is formed. Each of the first and second dielectric layers 103, 104 may be formed of at least one material selected from insulating materials including silicon oxide, silicon nitride, silicon carbide and silicon oxynitride. In this embodiment, the surface of the first dielectric layer 103 away from the substrate 101 may serve as the first bonding surface 100a of the device wafer 100.

In order to electrically interconnect the MEMS die 200 and the control unit in the device wafer 100, in this embodiment, an interconnection structure 300 is provided in the device wafer 100 and is electrically connected to each of the first contact pad 410 on the first bonding surface 100a and the control unit in the device wafer 100. Specifically, referring to FIG. 5, the interconnection structure 300 may include a conductive plug 310 that penetrates at least a part of the thickness of the device wafer 100 and is electrically connected to the corresponding control unit. The first contact pad 410 on the first bonding surface 100a is electrically connected to the corresponding conductive plug 310.

In case of a plurality of MEMS dies 200 being integrated, they may be of the same or different functions, uses or structures. MEMS dies for various MEMS devices such as gyroscopes, accelerometers, inertial sensors, pressure sensors, displacement sensor, micro-actuators (e.g., micro-motors, micro-resonators, micro-relays, micro-optical/RF switches, optical projection displays, flexible skins, micro-pump/valves) can be fabricated on separate substrates (e.g., silicon wafers) using MEMS die fabrication processes well known in the art and then diced into individual MEMS dies. The MEMS dies are served as MEMS dies 200 in this embodiment. In practical implementations, depending on the design requirements or the intended use, a number or plurality of MEMS dies 200 of different types may be selected and arranged on the first bonding surface 100a of the device wafer 100. For example, MEMS dies 200 of the same or different sensing functions may be bonded to the first bonding surface 100a of the device wafer 100. In this embodiment, the two MEMS chips 200 in FIG. 5 may be the gyroscope and the accelerometer respectively. In order to demonstrate improved function integration ability of the MEMS package structure, preferably, the above-mentioned multiple MEMS chips 200 belong to the same or different categories according to the fabrication process, here, the MEMS dies 200 are preferred to be fabricated using fabricating processes that are not completely the same, or to be of functions (or uses) that are not completely the same. In another embodiment, multiple MEMS chips are classified as the same or different according to the vacuum level in the corresponding micro-cavity. For example, the ratio of the vacuum level in the micro-cavity corresponding to the two MEMS chips can be greater than or equal to 10. In yet another embodiment, the plurality of MEMS chips may include at least one of a gyroscope, an accelerometer, an inertial sensor, a pressure sensor, a displacement sensor and a micro-actuator. According to requirements, the micro-cavities 210 of the multiple MEMS chips 200 may also be vacuumed or filled with damping gas.

It is to be understood that while the description of this embodiment focuses on the MEMS package structure including the device wafer 100 and a MEMS die 200 arranged on the first bonding surface 100a thereof, it does not imply that the MEMS package structure of the present embodiment is only made up of these components because the device wafer 100 may be further provided with one or more different chips arranged thereon or bonded thereto (e.g., memory chips, communication chips, processor chips, etc.), one or more different devices arranged thereon (e.g., power devices, bipolar devices, resistors, capacitors, etc.) and/or components and connection means well known in the art. The present invention is not limited to only one MEMS die 200 being bonded to the device wafer 100, as two, three or more MEMS dies can be bonded thereto. In the latter case, structures and/or types of these MEMS dies 200 may vary depending on the actual requirements. In addition, the first contact pads 410 and the second contact pads 220 described in this embodiment may be solder pads or other connecting components for electrical connection.

The MEMS die(s) 200 may be bonded to the first bonding surface 100a of the device wafer 100 by a bonding layer 500 (if a plurality of MEMS dies 200 are present, they may be arranged on the first bonding surface 100a side by side). The MEMS die 200 may have a closed micro-cavity 210, a second contact pad 220 for coupling to an external electrical signal and a second bonding surface 200a in opposition to the first bonding surface 100a. In addition, the second contact pad 220 of the MEMS die 200 may be electrically connected to an associated first contact pad 410 on the first bonding surface 100a of the device wafer 100, for example, via an electrical bump 600 arranged between the first contact pad 410 and corresponding second contact pad 220. A plurality of electrical bumps 600 may be provided so as to connect second contact pad 220 of each MEMS die 200 to corresponding first contact pad 410 of the device wafer 100.

The bonding layer 500 may be configured to fixedly bond the MEMS dies 200 to the device wafer 100. Specifically, the bonding layer 500 may be arranged between the first bonding surface 100a of the device wafer 100 and the second bonding surfaces 200a of the MEMS dies 200. Openings 510 may be formed in the bonding layer 500, in which the respective electrical bumps 600 and the input-output connecting member are exposed.

Examples of suitable materials for the bonding layer 500 may include oxides or other materials. For example, the bonding layer 500 may be a bonding material that bonds the second bonding surfaces 200a of the plurality of MEMS dies 200 to the first bonding surface 100a of the device wafer 100 by fusing bonding, vacuum bonding or otherwise. Examples of suitable materials for the bonding layer 500 may also include adhesive materials. In this case, for example, the bonding layer 500 may be a die attach film (DAF) or a dry film, which glues the MEMS dies to the device wafer 100 by adhesion. In this embodiment, the bonding layer 500 is preferably a dry film which is an adhesive photoresist film where a polymerization reaction can take place in the presence of ultraviolet radiation and produce a stable substance that adheres to a surface to be bonded. The dry film has the advantages of electroplating and etching resistance. The dry film may be so applied to the second bonding surfaces 200a of the MEMS dies 200 that the second contact pads 220 are exposed from the dry film, allowing the second contact pads 220 to be subsequently electrically connected to the respective first contact pads 410 of the device wafer 100 more easily. The second contact pad 220 of MEMS die 200 may be arranged, for example, at a location of the second bonding surface 200a of the MEMS die that is close to an edge of the second bonding surface 200a. In this way, the second contact pads 220 can be exposed when the openings 510 are formed in the bonding layer 500 at the edge of the MEMS die 200 or between the plurality of MEMS dies 200.

In this embodiment, the MEMS package structure may further include an encapsulation layer 501 located on the first bonding surface 100a of the device wafer 100. The encapsulation layer 501 covers the MEMS dies 200 and fills the openings 510 in the bonding layer 500. The encapsulation layer 501 is provided to more firmly fix the MEMS dies 200 to the device wafer 100 and protect them from external damage. The encapsulation layer 501 also exposes a plurality of input-output connecting members 420 on the first bonding surface 100a, so that the MEMS package structure can be connected to external control/processing signals through the input-output connecting member 420. The encapsulation layer 501 may be formed of, for example, a plastic material. For example, an injection molding process may be employed to fill the plastic material in gap(s) between the plurality of MEMS dies and fix the plurality of MEMS dies to the bonding layer 500. The plastic material of the encapsulation layer 501 may be in a softened or flowable form during the molding and may be molded in a predetermined shape. Alternatively, the material of the encapsulation layer 501 may solidify by chemical crosslinking. As an example, the material of the encapsulation layer 501 may include, for example, at least one of thermosetting resins including phenolic resins, urea-formaldehyde resins, formaldehyde-based resins, epoxy resins, polyurethanes and so on. Preferably, the material of the encapsulation layer 501 is selected as an epoxy resin. In the epoxy resin, a filler may be included, as well as one or more of various additives (e.g., curing agents, modifiers, mold release agents, thermal color agents, flame retardants, etc). For example, a phenolic resin may be added as a curing agent and a micro-powder consisting of solid silicon particles as a filler.

The MEMS package structure allows electrical interconnection between the MEMS die(s) 200 and the device wafer 100 with a reduced package size, compared to those produced by existing integration method. In addition, a plurality of MEMS dies 200 of the same or different functions (uses) and structures are allowed to be integrated on the same device wafer 100. Therefore, in addition to size shrinkage, the MEMS package structure is also improved in terms of function integration ability.

In embodiments of the present invention, there is provided a method for fabricating a MEMS package structure as defined above. Steps for fabricating the MEMS package structure are as follows:

step 1: providing a MEMS die and a device wafer for control of the MEMS die; the device wafer has a first bonding surface. A control unit and an interconnection structure electrically connected to the control unit are formed in the device wafer.

step 2: forming a first contact pad and an input-output connecting member on the first bonding surface, which is electrically connected to the interconnection structure; the MEMS die includes a closed micro-cavity, a second contact pad for coupling to an external electrical signal and a second bonding surface.

step 3: bonding the MEMS die to the device wafer by a bonding layer arranged between the first bonding surface and the second bonding surface; an opening is formed in the bonding layer, in which the first contact pad, the second contact pad and the input-output connecting member are exposed.

step 4: establishing an electrical connection between the first and second contact pads.

A more detailed process for fabricating a MEMS package structure in accordance with embodiments of the present invention will be described with reference to FIGS. 1 to 5.

Figure 1:
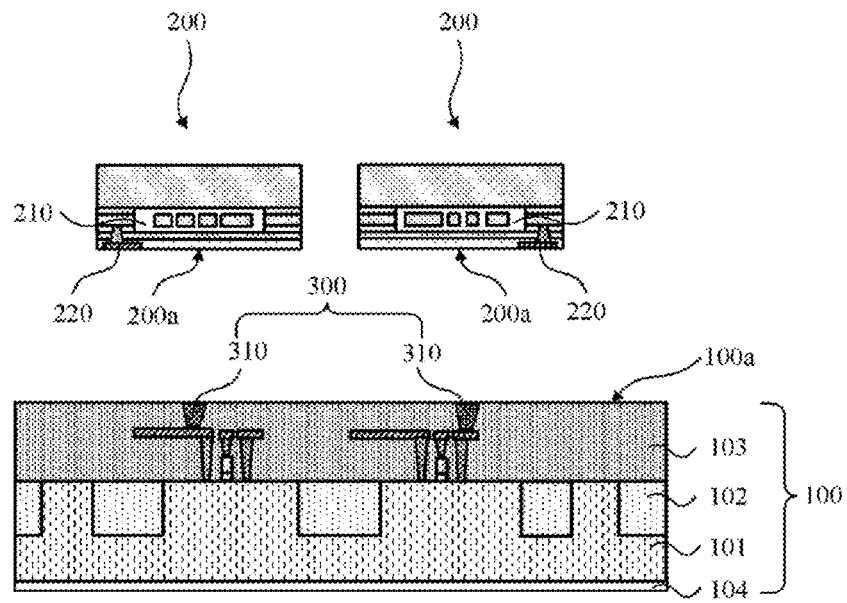
FIG. 1 is a schematic cross-sectional view showing a device wafer and a plurality of MEMS dies provided in a method of fabricating a MEMS package structure in accordance with an embodiment of the present invention.

FIG. 1 is a schematic cross-sectional view showing a device wafer and a plurality of MEMS dies provided in a method for fabricating a MEMS package structure in accordance with an embodiment of the present invention. Referring to FIG. 1, in step 1, the MEMS dies 200 and the device wafer 100 for control of the MEMS dies 200 are provided. The device wafer 100 has a first bonding surface 100a.

Control units and interconnection structures 300 electrically connected to the control units are formed in the device wafer 100. The MEMS die 200 has a closed micro-cavity 210, a second contact pad 220 for connecting external electrical signals, and a second bonding surface 200a. The first bonding surface 100a and the second bonding surface 200a are surfaces of the device wafer 100 and the MEMS chip 200 respectively for bonding the device wafer 100 and the MEMS chip 200.

Specifically, in this embodiment, the device wafer 100 may include a substrate 101, which is a silicon substrate or silicon-on-insulator (SOI) substrate, for example. In this embodiment, a plurality of MEMS dies are integrated in the same device wafer and a plurality of control units may be accordingly formed in the device wafer 100. The plurality of control units may be formed on the basis of the substrate 101 using an established semiconductor process in order to subsequently control the plurality of MEMS dies. Each control unit may consist of a set of CMOS control circuits. For example, each control unit may include one or more MOS transistors, and in the latter case, adjacent said MOS transistors may be isolated from one another by isolation structure(s) 102 formed in the substrate 101 (or in the device wafer 100) and by an insulating material covered on the substrate 101. The isolation structure 102 may be, for example, a shallow trench isolation (STI) and/or deep trench isolation (DTI) structure. The device wafer 100 may further include a first dielectric layer 103 formed on one surface of the substrate 101 and a second dielectric layer 104 formed on the surface of the other side of the substrate 101. A connection terminal of each control unit for outputting a control electrical signal may be arranged in the first dielectric layer 103. In this embodiment, the surface of the first dielectric layer 103 away from the substrate 101 may serve as the bonding surface 101a of the device wafer 100. In another embodiment, the surface of the second dielectric layer 104 away from the substrate 101 may serve as the bonding surface 101a of the device wafer 100. The device wafer 100 may be fabricated using a method known in the art.

The interconnection structure 300 may include, formed within the device wafer 100, two or more electrical contacts, electrical connection members and electrical connection lines therebetween. In this embodiment, the interconnection structure 300 in the device wafer 100 may include a conductive plug 310 which penetrates through at least a partial thickness of the device wafer 100 and is electrically connected to the control unit in the device wafer 100. During integration of the plurality of MEMS dies, a plurality of conductive plugs 310 are formed in the device wafer 100. The conductive plug 310 may be formed of a conductive material selected as a metal or alloy containing cobalt, molybdenum, aluminum, copper, tungsten or the like, or as a metal silicide (e.g., titanium silicide, tungsten silicide, cobalt silicide, or the like), a metal nitride (e.g., titanium nitride), doped polysilicon, or the like.

The plurality of MEMS dies 200 may be of the same or different functions, uses or structures. In this embodiment, in order for the MEMS package structure to be versatile or multi-functional, the MEMS dies to be integrated are preferably of two or more different types. For example, the plurality of MEMS dies may be at least two selected from those for a gyroscope, an accelerometer, an inertial sensor, a pressure sensor, a flow sensor, a displacement sensor and a micro-actuator, or at least two selected from those for an electric field sensor, an electric field intensity sensor, a current sensor, a flux sensor and a magnetic field intensity sensor. In this embodiment, each MEMS die 200 may be an independent chip (or die) with a closed micro-cavity 210 serving as a sensing component and a second contact pad for receiving an external electrical signal (to control operation of the MEMS die). The second contact pad 220 may be located on the second bonding surface 200a of corresponding MEMS dies, for example, at a location close to an edge of the second bonding surface 200a. This can facilitate exposure of the second contact pad 220 when an opening 510 is subsequently formed in the bonding layer 500 between the MEMS dies. However, the present invention is not limited thereto, because depending on how the MEMS die is wired, the second contact pad 220 may also be arranged at another location on the surface of the MEMS die.

Within the micro-cavity 210 of the MEMS die 200, there is a high- or low-vacuum environment or filled with a damping gas. It can be understood that although only two MEMS dies are shown in FIG. 1, the manufacturing method of the MEMS package structure of this embodiment can also be applied to a situation including one or more than two MEMS dies. The MEMS die 200 can be manufactured using method disclosed in the art.

Figure 2:
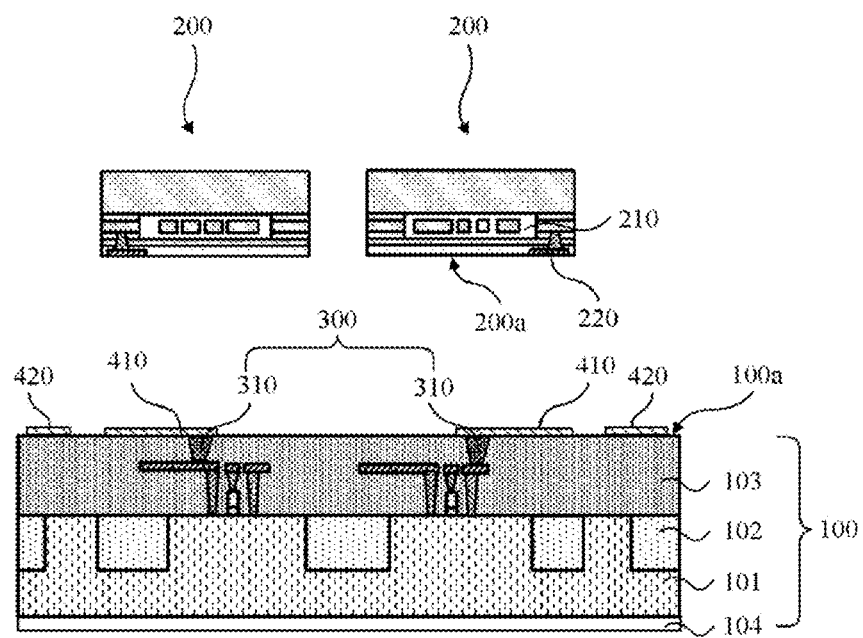
FIG. 2 is a schematic cross-sectional view showing a structure resulting from the formation of a plurality of first contact pads and a plurality of input-output connecting members on a first bonding surface in the method of fabricating a MEMS package structure in accordance with an embodiment of the present invention.

FIG. 2 is a schematic cross-sectional view showing a structure resulting from the formation of a plurality of first contact pads and a plurality of input-output connecting members on a first bonding surface in the method of fabricating a MEMS package structure in accordance with an embodiment of the present invention. Referring to FIG. 2, in step 2, the plurality of first contact pads 410 and the plurality of input-output connecting members 420 are formed on the first bonding surface 100a. The first contact pads 410 are electrically connected to the interconnection structure 300 of the device wafer 100.

The first contact pads 410 and the input-output connecting members 420 may be formed using the same film-forming and patterning process. For example, a metal layer may be deposited on the first bonding surface 100a of the device wafer 100. The metal layer may be formed of the same material as that of the conductive plug 310 by physical vapor deposition (PVD), atomic layer deposition (ALD) or chemical vapor deposition (CVD) and then patterned to form the first contact pads 410 and the input-output connecting members 420. The first contact pads 410 are electrically connected to the interconnection structures 300 to lead electrical signals of the control units. The input-output connecting member 420 is used to connect to the external signal or device of the MEMS package structure to process or control the circuit signal connected thereto. As an example, the multiple input-output connecting members 420 and the multiple first contact pads 410 are in one-to-one correspondence and are electrically connected, so that the electrical signals at the multiple first contact pads 410 can be processed or controlled through the multiple input-output connecting members 420.

Figure 3:
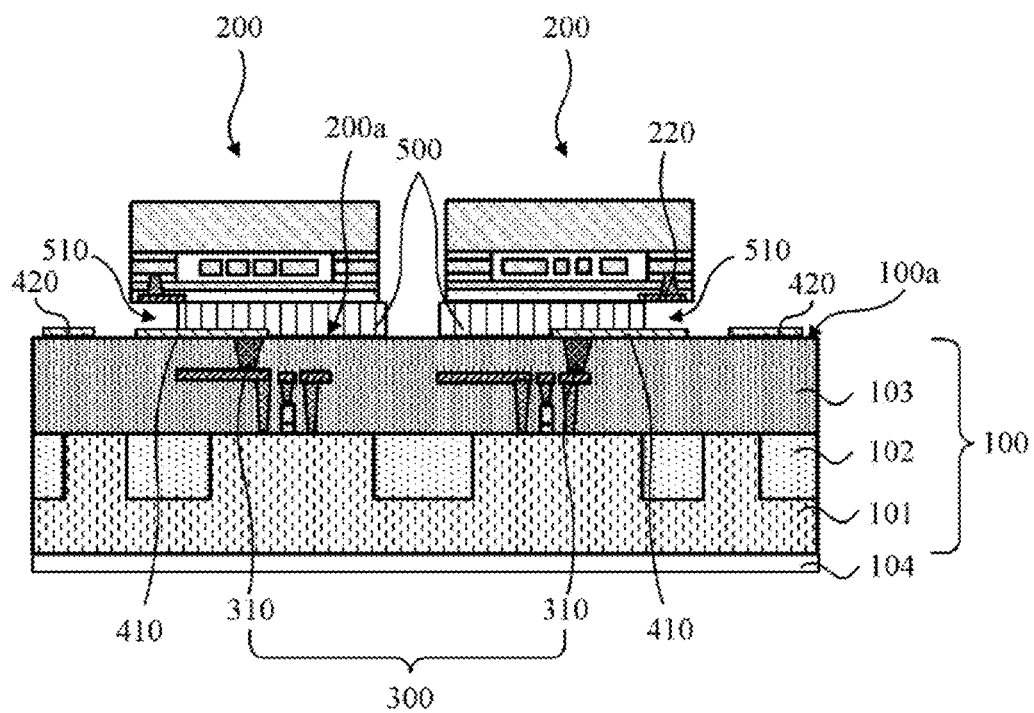
FIG. 3 is a schematic cross-sectional view showing a structure resulting from bonding the plurality of MEMS dies to the device wafer using a bonding layer in the method of fabricating a MEMS package structure in accordance with an embodiment of the present invention.

FIG. 3 is a schematic cross-sectional view showing a structure resulting from bonding the plurality of MEMS dies to the device wafer using a bonding layer in the method of fabricating a MEMS package structure in accordance with an embodiment of the present invention. Referring to FIG. 3, in step 3, the MEMS dies 200 are bonded to the device wafer 100 using the bonding layer 500 positioned between the first bonding surface 100a and the second bonding surface 200a. Openings 510 are formed in the bonding layer 500, in which the first contact pads 410, the respective second contact pads 201 and the input-output connecting members 420 are exposed.

Optionally, the bonding of the plurality of MEMS dies 200 to the device wafer 100 may be accomplished with, for example, a fusing bonding process or vacuum bonding process. In this case, the bonding layer 500 may be formed of a bonding material (e.g., silicon oxide). Alternatively, the bonding of the plurality of MEMS dies 200 to the device wafer 100 may be accomplished by both a bonding process and a light (or thermal) curing process. In this case, the bonding layer 500 may include an adhesive material, in particular, a die attach film or a dry film. The plurality of MEMS dies may be bonded one by one, or the plurality of MEMS dies may be transferred to one or more carrier plates and then bonded onto the device wafer 100 at the same time or in batches.

In an optional embodiment, during the bonding of the MEMS dies 200 to the device wafer 100, the bonding material may be applied only to intended locations of the device wafer 100 such that the second contact pads 220, the corresponding first contact pads 410 and the input-output connecting member 420 remain exposed, thus resulting in the formation of the openings 510 in the bonding layer 500. In an alternatively embodiment, during the bonding of the MEMS dies 200 to the device wafer 100, the bonding material may be applied to both the first bonding surface 100a and the second bonding surfaces 200a, followed by the formation of the openings 510 in which the second contact pads 220, the first contact pads 410 and the input-output connecting member 420 are exposed, for example, using a dry etching process. The openings 510 in the bonding layer 500 are formed in order to enable connection of the first contact pads 410 of the control units in the device wafer 100 to the respective second contact pads 220 in the MEMS dies 200 between the first bonding surface 100a and the second bonding surface 200a.

Figure 4:
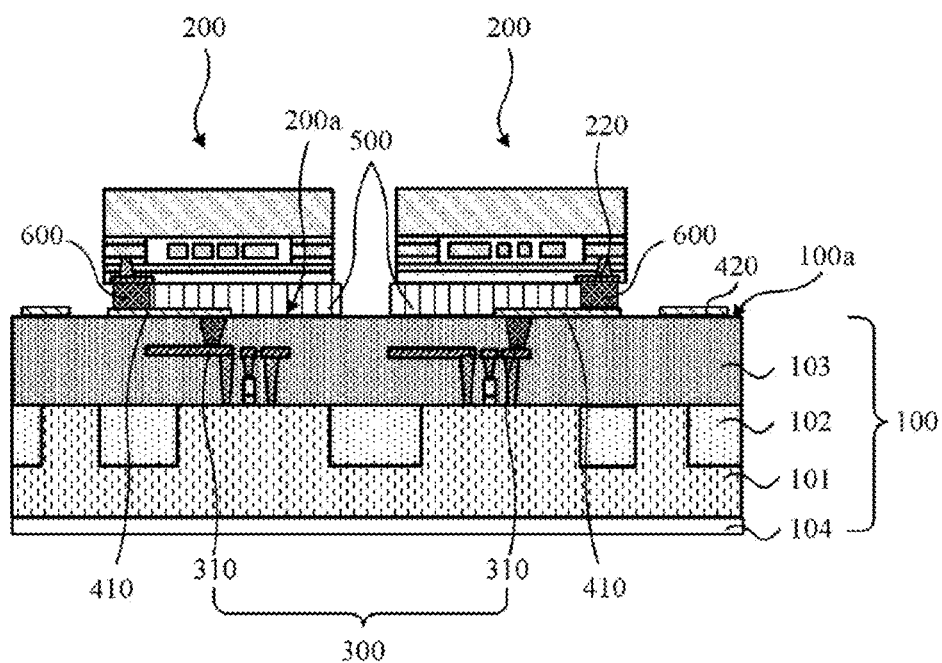
FIG. 4 is a schematic cross-sectional view showing a structure resulting from the formation of an electrical bump in the method of fabricating a MEMS package structure in accordance with an embodiment of the present invention.

FIG. 4 is a schematic cross-sectional view showing a structure resulting from the formation of an electrical bump in the method of fabricating a MEMS package structure in accordance with an embodiment of the present invention. Referring to FIG. 4, in step 4, electrical connections are established between the first contact pads 410 and the respective second contact pads 220.

In this embodiment, the first contact pads 410 and the respective second contact pad 220 are exposed in the openings 510 formed in the bonding layer 500, and electrical bumps 600 may be formed between the first and second contact pads 410, 220 to connect them together. The remaining part of the openings 510 are not filled up and the electrical bumps 600 are exposed in the openings 510.

The formation of the electrical bumps 600 may be accomplished using an electroless plating involving, for example, placing the device wafer 100 with the plurality of MEMS dies 200 bonded thereon and with the openings 510 formed in the bonding layer 500 into a solution containing metal ions (e.g., a solution for electroless plating of silver, nickel, copper or the like), where the metal ions are reduced by a strong reducing agent into the corresponding metal which is deposited onto the first contact pads 410 and the respective second contact pads 220 exposed in the openings 510. After the lapse of a certain length of time, the metal connects the first contact pad 410 to the respective second contact pads 220, thus resulting in the formation of the electrical bumps 600. Examples of suitable materials for the electrical bumps 600 may include one or more of copper, nickel, zinc, tin, silver, gold, tungsten and magnesium. The electroless plating process may further involve, before the placement into the solution containing metal ions, depositing a seed layer at intended locations in the openings 510 where the electrical bumps 600 are to be formed.

Forming the electrical bumps 600 between the first bonding surface 100a and the second bonding surfaces 200a enables electrical connection between the first contact pads 410 and the respective second contact pads 220 without the need for wire bonding. This is conducive to size shrinkage of the MEMS package structure and can improve its reliability by not affecting the inside of the device wafer 100.

FIG. 5 is a schematic cross-sectional view showing a structure resulting from the formation of an encapsulation layer in the method of fabricating a MEMS package structure in accordance with an embodiment of the present invention. Referring to FIG. 5, in order to protect the MEMS dies 200 on the device wafer 100 from external factors (e.g., moisture, oxygen, vibration, shock, etc.) and fix them more firmly, in this embodiment, subsequent to the formation of the electrical bumps 600, the method for fabricating a MEMS package structure further comprises: forming the encapsulation layer 501 on the first bonding surface 100a, which covers the MEMS dies 200 and fills the openings 510 of the bonding layer 500. the input-output connecting member 420 is exposed from the encapsulation layer 501.

Examples of suitable materials for the encapsulation layer 501 may include: inorganic insulating materials, such as silicon oxide, silicon nitride, silicon carbide, silicon oxynitride, etc.; thermoplastic resins, such as polycarbonate, polyethylene terephthalate, polyethersulfone, polyphenylether, polyamides, polyetherimides, methacrylic resins, cyclic polyolefin based resins, etc.; thermosetting resins, such as epoxy resins, phenolic resins, urea-formaldehyde resins, formaldehyde-based resins, polyurethanes, acrylic resins, vinyl ester resins, imide based resins, urea resins, melamine resins, etc.; and organic insulating materials, such as polystyrene, polyacrylonitrile, etc. The encapsulation layer 501 may be formed using, for example, a chemical vapor deposition process or an injection molding process. The packaging layer 501 should expose the multiple input-output connecting member 420 on the first bonding surface 100a of the device wafer 100 to facilitate the connection of the MEMS package structure with external control/processing signals.

By the method of fabricating a MEMS package structure according to the above embodiment, an electrical interconnection between the MEMS die 200 and device wafer 100 is achieved. This allows a reduced package structure size, compared with those produced by existing integration methods. In addition, the plurality of MEMS dies integrated on the same device wafer may be of the same or different functions (uses) and structures. Therefore, in addition to size shrinkage, the MEMS package structure is also improved in terms of function integration ability.

Described above are merely several preferred embodiments of the present invention, which are not intended to limit the present invention in any sense. In light of the principles and teachings hereinabove, any person of skill in the art may make various possible variations and changes to the disclosed embodiments, without departing from the scope of the invention. Accordingly, any and all such simple variations, equivalent alternatives and modifications made to the foregoing embodiments without departing from the scope of the invention are intended to fall within the scope thereof.

What is claimed is:

1. A micro-electro-mechanical system (MEMS) package structure, comprising:

a device wafer having a first bonding surface, wherein the device wafer has a control unit and an interconnection structure electrically connected to the control unit formed therein;

a first contact pad arranged on the first bonding surface, wherein the first contact pad is electrically connected to the interconnection structure;

a MEMS die bonded to the first bonding surface, wherein the MEMS die comprises a closed micro-cavity, a second contact pad configured to be coupled to an external electrical signal and a second bonding surface in opposition to the first bonding surface, the first contact pad electrically connected to a corresponding second contact pad;

a bonding layer positioned between the first bonding surface and the second bonding surface so as to bond the MEMS die to the device wafer, wherein an opening is formed in the bonding layer; and an input-output connecting member arranged on the first bonding surface, wherein the input-output connecting member is exposed in the opening.

2. The MEMS package structure of claim 1, wherein a plurality of MEMS dies are bonded to the first bonding surface, and wherein the plurality of MEMS dies are categorized in a same or different types depending on a fabrication process thereof.

3. The MEMS package structure of claim 1, wherein a plurality of MEMS dies are bonded to the first bonding surface, and wherein the plurality of MEMS dies are categorized in a same or different types depending on a vacuum level of the micro-cavity thereof.

4. The MEMS package structure of claim 1, wherein a plurality of MEMS dies are arranged on the first bonding surface, and wherein the plurality of MEMS dies include at least one of: a gyroscope, an accelerometer, an inertial sensor, a pressure sensor, a displacement sensor and a micro-actuator.

5. The MEMS package structure of claim 1, wherein the control unit comprises one or more MOS transistors.

6. The MEMS package structure of claim 1, wherein the interconnection structure comprises a conductive plug extending through at least a partial thickness of the device wafer and electrically connected to the control unit, and wherein the first contact pad is electrically connected to the conductive plug.

7. The MEMS package structure of claim 1, wherein the first contact pad is electrically connected to the corresponding second contact pad via an electrical bump, and wherein the electrical bump is positioned between the first contact pad and the corresponding second contact pad, and is exposed in the opening.

8. The MEMS package structure of claim 1, further comprising
an encapsulation layer located on the first bonding surface, wherein the encapsulation layer covers the MEMS die and fills the opening in the bonding layer, and wherein the input-output connecting member is exposed from the encapsulation layer.

9. The MEMS package structure of claim 1, wherein the input-output connecting member corresponds to the first contact pad and is electrically connected thereto.

10. The MEMS package structure of claim 1, wherein the bonding layer comprises an adhesive material.

11. The MEMS package structure of claim 10, wherein the adhesive material comprises a dry film.

12. The MEMS package structure of claim 1, wherein the micro-cavity is filled with a damping gas or is vacuumed.

13. A method for fabricating a micro-electro-mechanical system (MEMS) package structure, comprising:

providing a MEMS die and a device wafer for control of the MEMS die, wherein the device wafer has a first bonding surface, and wherein the device wafer has a control unit and an interconnection structure electrically connected to the control unit formed therein;

forming a first contact pad and an input-output connecting member on the first bonding surface, wherein the first contact pad is electrically connected to the interconnection structure, wherein the MEMS die comprises a closed micro-cavity, a second contact pad configured to be coupled to an external electrical signal and a second bonding surface;

bonding the MEMS die to the device wafer through a bonding layer positioned between the first bonding surface and the second bonding surface, wherein the bonding layer has an opening formed therein, wherein the first contact pad, a corresponding second contact pad and the input-output connecting member are exposed in the opening;

establishing an electrical connection between the first contact pad and the corresponding second contact pad.

14. The method for fabricating a MEMS package structure of claim 13, wherein the interconnection structure comprises a conductive plug, wherein the conductive plug extends through at least a partial thickness of the device wafer and is electrically connected to the control unit, and wherein the first contact pad is electrically connected to a corresponding conductive plug.

15. The method for fabricating a MEMS package structure of claim 13, wherein establishing the electrical connection between the first contact pad and the corresponding second contact pad comprises: forming an electrical bump between the first contact pad and the corresponding second contact pad using an electroless plating process, wherein the electrical bump is exposed in the opening.

16. The method for fabricating a MEMS package structure of claim 13, further comprising, subsequent to forming the electrical connection between the first contact pad and the corresponding second contact pad:

forming an encapsulation layer on the first bonding surface, wherein the encapsulation layer covers the MEMS die and fills the opening, with the input-output connecting member being exposed from the encapsulation layer.

* * * * *